United States Patent
Sasaki et al.

[11] Patent Number: 6,016,087
[45] Date of Patent: Jan. 18, 2000

[54] COUPLED MICROSTRIP LINES

[75] Inventors: Yutaka Sasaki, Nagaokakyo; Hidefumi Nakanishi, Shiga-ken; Hiroaki Tanaka, Osaka-fu, all of Japan

[73] Assignee: Murata Manufacturing Co., Ltd., Japan

[21] Appl. No.: 08/990,858

[22] Filed: Dec. 15, 1997

[30] Foreign Application Priority Data

Dec. 16, 1996 [JP] Japan .................................. 8-335691

[51] Int. Cl.⁷ ...................................................... H01P 5/18
[52] U.S. Cl. ......................... 333/116; 333/238; 29/829; 156/47
[58] Field of Search ................... 333/116, 238; 29/829; 156/47

[56] References Cited

U.S. PATENT DOCUMENTS

| | | | |
|---|---|---|---|
| 5,017,509 | 5/1991 | Tuckerman | 437/182 |
| 5,329,263 | 7/1994 | Minami | 333/116 |
| 5,493,263 | 2/1996 | Tozawa | 333/238 |

FOREIGN PATENT DOCUMENTS

| | | |
|---|---|---|
| 0354671 | 2/1990 | European Pat. Off. . |
| 2601147 | 7/1977 | Germany . |
| 1302658 | 1/1973 | United Kingdom . |

OTHER PUBLICATIONS

Jansen, R.H.: Streifenleitungstechnik (Mikrostrip-Technik)—Ein Überblick über die physikalischen Grundprinzipien und Bauelemente (1. Teil). In: Ntz Archiv, 1981, pp. 159–167.

German Office Action dated Dec. 14, 1998 and translation.
Great Britain Office Action and Search Report dated Mar. 26, 1998.
Great Britain Online Search dated Apr. 7, 1998.

*Primary Examiner*—Paul Gensler
*Attorney, Agent, or Firm*—Ostrolenk, Faber, Gerb & Soffen, LLP

[57] ABSTRACT

In a coupled line, microstrip lines are formed so as to be arranged with a spacing that is narrower than the smallest possible space that is obtainable with a conventional electrode forming process, on a top side thereof spaced away from a dielectric substrate. The microstriplines have a trapezoid-shaped cross-section with the narrower major surface at the bottom, in contact with the dielectric substrate. Such formation makes it possible to strengthen the coupling between the microstrip lines, and to reduce the conductor loss of the microstrip lines.

2 Claims, 2 Drawing Sheets

COUPLED MICROSTRIP LINES

BACKGROUND OF THE INVENTION

1. Field of the Invention

The present invention relates to a coupled line, and more particularly, to a coupled line for use at high frequencies.

2. Description of the Related Art

FIG. 4 is a cross-sectional view of a conventional coupled line including microstrip lines. Referring to FIG. 4, a coupled line 20 comprises a dielectric substrate 21, microstrip lines 22 and 23, and a ground electrode 24. The microstrip lines 22 and 23 have a rectangular cross-section, are arranged with a space g3 therebetween, and are electromagnetically coupled to each other.

However, in the aforesaid prior art, it is impossible to make the space between two microstrip lines smaller than the smallest space which is obtainable by a conventional electrode forming process, because light enters the area under the photomask which should remain unexposed, to produce the space between the two microstrip lines, when the resist adjacent to the photomask is exposed. Accordingly, the area under the photomask is also exposed and it is impossible to produce the space. Therefore, the degree of coupling between the microstrip lines, which depends on the space therebetween, is limited by the electrode forming process.

SUMMARY OF THE INVENTION

The present invention is able to solve the above problem. The invention provides a coupled line in which the degree of coupling between microstrip lines has been increased by making the space therebetween less than the smallest possible space that can be obtained in a conventional electrode forming process, and a method of producing the coupled line.

In order to achieve the above result, according to an aspect of the present invention, there is provided a coupled line having two or more microstrip lines closely arranged on the upper surface of a dielectric substrate with a ground electrode on the lower surface thereof, wherein the space between respective top sides of said microstrip lines is smaller than the space between respective bottom sides thereof in contact with the dielectric substrate.

Preferably, a dielectric is provided between the adjacent microstrip lines.

According to another aspect of the present invention, there is provided a method of producing a coupled line which comprises the steps of applying a resist onto the upper surface of a dielectric substrate having a ground electrode on the lower surface thereof, exposing the resist applied onto the upper surface of the dielectric substrate, with a photomask laid thereon, removing an unnecessary part of the resist from the upper surface of the dielectric substrate by developing the resist, forming on the upper surface of the dielectric substrate two parallel and close strip electrodes having the same thickness as the resist, and removing the remaining resist from the dielectric substrate.

According to a further aspect of the present invention, there is provided a method of producing a coupled line which omits the above-mentioned step of removing the remaining resist from the dielectric substrate.

In the coupled line produced by the above methods, the space between microstrip lines is allowed to be smaller than the smallest possible space that can be obtained by a conventional electrode forming process.

BRIEF DESCRIPTION OF THE DRAWINGS

FIG. 3A shows a step in which a resist is applied onto a dielectric substrate having a ground electrode formed thereon, FIG. 3B shows a step in which the resist is exposed, FIG. 3C shows a step in which exposed parts of the resist are removed, FIG. 3D shows a step in which microstrip lines are formed in sections cleared of the parts of the resist, and FIG. 3E shows a state in which the remaining resist is removed.

DESCRIPTION OF EMBODIMENTS OF THE INVENTION

Figure 1:
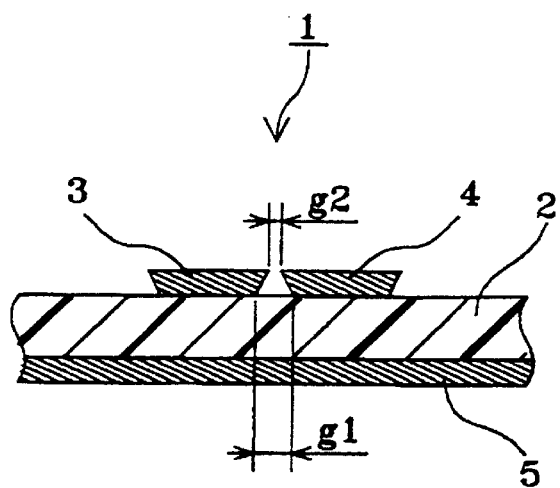
FIG. 1 is a cross-sectional view of a coupled line according to an embodiment of the present invention.

FIG. 1 is a cross-sectional view of a coupled line according to an embodiment of the present invention. Referring to FIG. 1, a coupled line 1 comprises a dielectric substrate 2, two parallel and close microstrip lines 3 and 4, and a ground electrode 5. The microstrip lines 3 and 4 are arranged with a space g1 therebetween, which is the smallest possible space that can be obtained in a conventional electrode forming process, at the bottom sides thereof in contact with the dielectric substrate 2, and are arranged for being electromagnetically coupled to each other.

The microstrip lines 3 and 4 have a cross-section shaped like a trapezoid which is wide at the top side and narrow on the bottom side which is in contact with the dielectric substrate 2. Therefore, a space g2 between the microstrip lines 3 and 4 at the top side is smaller than the smallest possible space g1 therebetween which is obtainable in the conventional electrode forming process.

Such formation of the coupled line allows the space between the microstrip lines 3 and 4 to be made smaller than the smallest possible space previously obtainable. As a result, it is possible to increase the capacitance between the microstrip lines 3 and 4, and to thereby strengthen the coupling therebetween. Furthermore, since the widths of the microstrip lines 3 and 4 at their top sides are increased, the cross-sectional areas thereof also increase, whereby conductor loss is reduced.

Figure 2:
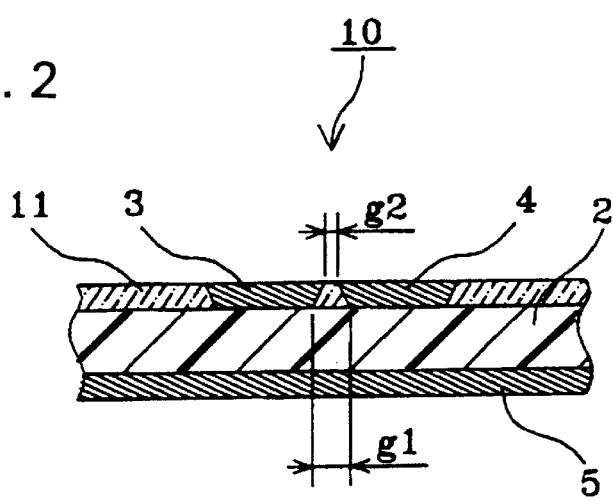
FIG. 2 is a cross-sectional view of a coupled line according to another embodiment of the present invention.
Figure 4:
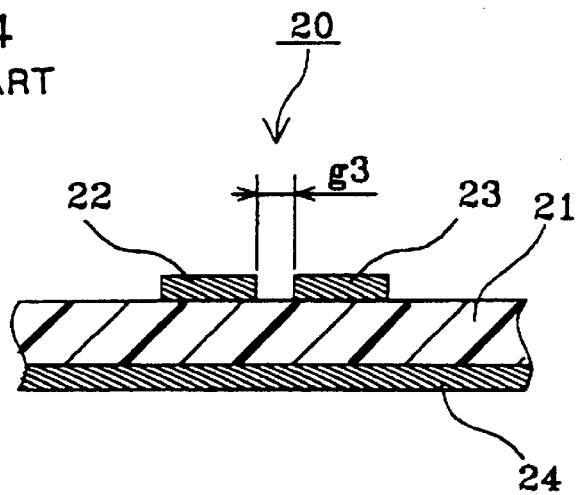
FIG. 4 is a cross-sectional view of a conventional coupled line.

FIG. 2 is a cross-sectional view of a coupled line according to another embodiment of the present invention. In FIG. 2, the same components as in FIG. 1 are denoted by the same numerals, and a description thereof is omitted. Referring to FIG. 2, a dielectric 11 having the same thickness as microstrip lines 3 and 4 is provided on the upper surface of a dielectric substrate 2 except where the microstrip lines 3 and 4 are formed, and particularly, is provided between the microstrip lines 3 and 4.

Such formation of the coupled line makes it possible to increase the capacitance between the microstrip lines 3 and 4, and to thereby further strengthen the coupling therebetween.

FIGS. 3A to 3E are cross-sectional views of the production process of the coupled line of the present invention. The components which are the same as or equivalent to those in FIGS. 1 and 2 are denoted by the same numerals.

A method of producing a coupled line according to the present invention will be described below with reference to FIGS. 3A to 3E.

Figure 3A:
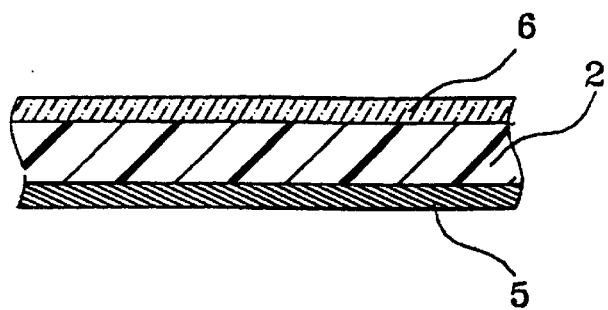
FIGS. 3A to 3E are views showing a procedure for producing a coupled line according to an embodiment of the present invention.

First, as shown in FIG. 3A, a dielectric substrate 2 with a ground electrode 5 formed on the lower surface thereof is prepared, and a resist 6 having almost the same thickness as that of electrodes to be formed as strip lines is applied on the upper surface of the dielectric substrate 2. (Step 1.)

Figure 3B:
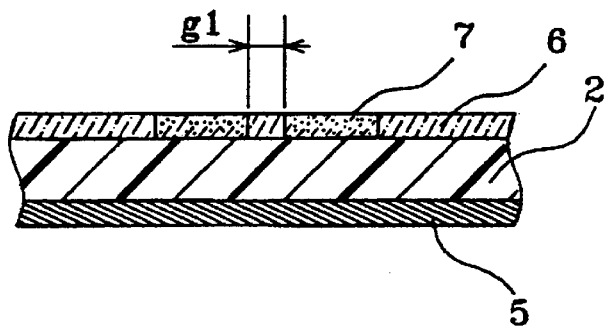

Next, a photomask with lines formed corresponding to microstrip lines 3 and 4 is laid on the resist 6, and the resist 6 is exposed. Thus, only sections 7 of the resist 6 (where microstrip lines are to be formed) are exposed to light, as shown in FIG. 3B. At this time, since the pattern on the photomask is designed with the greatest fineness possible in the electrode forming process, the space g1 is the smallest possible space that is obtainable by this method. (Step 2.)

Figure 3C:
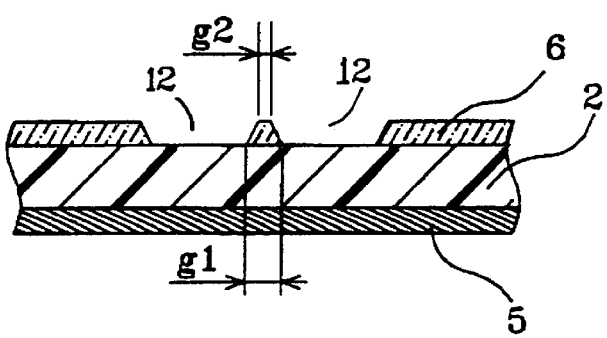

Then, as shown in FIG. 3C, the exposed resist sections 7 are removed by development, forming openings 12. At the same time, edges of unexposed sections of the resist 6 adjacent to the exposed resist sections 7 are also removed diagonally by controlling the conditions of exposure in Step 2 and the conditions of development in this Step 3. The openings 12 are thereby shaped like trapezoids. The inclination of the sides of the trapezoids can be adjusted by changing the conditions of exposure in Step 2. (Step 3.) As the exposure becomes stronger, or when the development time is made longer, the inclination of the sides of the trapezoid becomes gentler. As the exposure becomes weaker, or when the development time i made shorter, the inclination of the sides of the trapezoid becomes steeper.

Figure 3D:
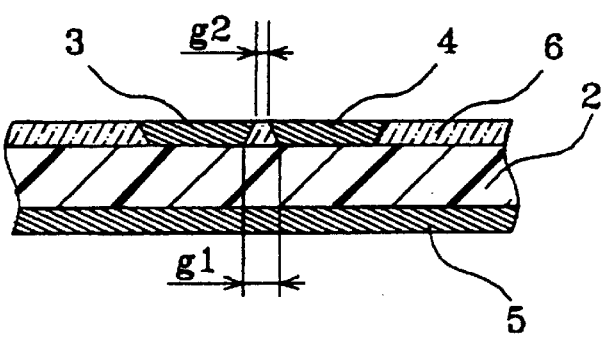

Next, as shown in FIG. 3D, two parallel and close microstrip lines 3 and 4, which have a thickness almost equal to or less than that of the resist 6, are formed, by plating, evaporation, sputtering or the like, in the openings 12 on the dielectric substrate 2 where the exposed resist sections 7 were removed. The shapes of the microstrip lines 3 and 4 are each widened toward the top sides thereof because of the inclination of the sides of the openings 12 in cross section. As a result, a space g2 between the microstrip lines 3 and 4 at the top sides thereof is less than the space g1, which is the smallest possible space on a photomask, by the inclinations of the cross-sections thereof. (Step 4.)

Figure 3E:
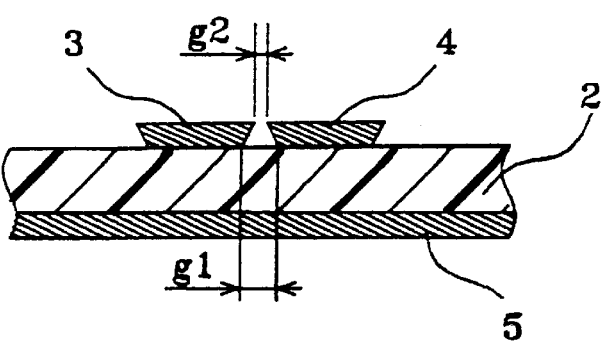

Finally, the resist 6 is removed from the dielectric substrate 2 by a solvent or the like as shown in FIG. 3E. (Step 5.)

As described above, a coupled line, in which the space between the two microstrip lines 3 and 4 is smaller at their top sides than at the bottom sides in contact with the dielectric substrate 2, as shown in FIG. 1, may be produced by Steps 1 to 5.

If Step 5 is omitted, a coupled line can be produced in which the dielectric 11 is provided between the two microstrip lines 3 and 4, as shown in FIG. 2. In this case, the resist 6 serves as the dielectric 11 shown in FIG. 2. In these embodiments, the space g2 between the two microstrip lines 3 and 4 on the front side is less than the smallest possible space g1 that can conventionally be made by the photomask.

Although in the dielectric substrate in the embodiment shown in FIGS. 3A to 3E, a ground electrode is previously formed on the base thereof, the same advantages can be obtained if a ground electrode is formed after forming the microstrip lines.

Such formation of the coupled line makes it possible to make the space between the microstrip lines at the top sides less than the smallest possible space that can be made by a conventional photomask, and to thereby further strengthen the coupling between the microstrip lines. Moreover, since the cross-sectional area of each microstrip line increases, the conductor loss thereof can be reduced.

In particular, when a dielectric is provided between the microstrip lines, the capacitance therebetween increases, which further increases the degree of coupling therebetween.

Although two microstrip lines are coupled in the above embodiments, even if the number of microstrip lines is equal to or more than three, the same operation and advantages can be obtained.

Furthermore, although the above embodiments use a positive resist whose exposed area is removed to form an electrode, a negative resist whose unexposed area is removed to form an electrode may be used instead.

What is claimed is:

1. A coupled line having two microstrip lines closely arranged on an upper surface of a dielectric substrate with a ground electrode on a lower surface thereof, wherein a space between the microstrip lines at a top side thereof is smaller than the space therebetween at a bottom side thereof in contact with said dielectric substrate, said two microstrip lines being electromagnetically coupled with each other.

2. A coupled line according to claim 1, wherein a dielectric is provided between said microstrip lines.

* * * * *